United States Patent [19]

Okumura et al.

[11] Patent Number: 4,808,829

[45] Date of Patent: Feb. 28, 1989

[54] MARK POSITION DETECTION SYSTEM FOR USE IN CHARGED PARTICLE BEAM APPARATUS

[75] Inventors: Masahide Okumura, Sagamihara; Takashi Matsuzaka, Kokubunji; Genya Matsuoka, Ome; Kazumi Iwadate, Isehara; Tadahito Matsuda, Atsugi; Ryoichi Yamaguchi, Zami, all of Japan

[73] Assignees: Hitachi Ltd.; Nippon Telegraph and Telephone Corp., both of Tokyo, Japan

[21] Appl. No.: 63,018

[22] Filed: Jun. 17, 1987

[30] Foreign Application Priority Data

Jun. 18, 1986 [JP] Japan ................................. 61-140069

[51] Int. Cl.[4] ............................................. G01N 23/22
[52] U.S. Cl. .................................. 250/491.1; 250/310
[58] Field of Search ............................... 250/491.1, 310

[56] References Cited

U.S. PATENT DOCUMENTS 4,286,154  8/1981  Okubo et al. ................... 250/491.1

Primary Examiner—Carolyn E. Fields
Assistant Examiner—John A. Miller
Attorney, Agent, or Firm—Antonelli, Terry & Wands

[57] ABSTRACT

A mark position detection system used in a charged particle beam apparatus and including detection circuit for detecting a reflected electron generated at a mark when the mark is scanned with a charged particle beam, to obtain a mark signal, and signal processing circuit for comparing the mark signal from the detection circuit with a predetermined threshold level to find the position of the charged particle beam at a time the mark signal traverses the threshold level, thereby detecting the position of a mark edge, is disclosed in which, when the mark signal traverses the threshold level and has a peak value exceeding a predetermined value, it is determined by the signal processing circuit that the position of the charged particle beam at a time point at which the mark signal traverses the threshold level is the position of the mark.

4 Claims, 4 Drawing Sheets

MARK POSITION DETECTION SYSTEM FOR USE IN CHARGED PARTICLE BEAM APPARATUS

BACKGROUND OF THE INVENTION

The present invention relates to a mark position detection system for use in a charged particle beam apparatus, and more particularly to a mark position detection system capable of detecting a mark position with high accuracy on a workpiece which is set in a charged particle beam apparatus such as an electron beam lithography apparatus for fabricating a semiconductor large scale integration circuit or the like.

An electron beam lithography apparatus is used for writing fine patterns on a mask or wafer with an electron beam. For example, in the case of direct writing, it is required to write a pattern on a wafer so that the pattern is placed accurately at a predetermined position on the wafer. For this reason, as shown in FIG. 4A, a mark 2 for positioning is previously formed in the surface of a wafer as a difference in surface level, and the wafer surface including the mark 2 is scanned with an electron beam 1 to reflect electrons from the wafer surface. The reflected electrons are detected to obtain a mark signal corresponding to the intensity of reflected electrons. The mark signal thus obtained is used for determining the position of the mark (namely, the mark position), and a pattern can be written on the wafer at a predetermined position thereof by using the mark position as a reference position.

A method of detecting a mark position with high accuracy, is disclosed in, for example, JP-A-No. 59-222930. In this method, the positions of maximum and minimum levels of a mark signal are detected, and on the basis of the above positions a specific region of the mark signal is determined so that mark edge data falling within this region is used to obtain a mark position. Another conventional method of determining a mark position will be explained below, with reference to FIGS. 4A to 4F. This method is disclosed, for example, in JP-A-No. 56-15040. When the wafer surface shown in FIG. 4A and including the mark 2 is scanned with the electron beam 1 in a direction from left to right, and the reflected electrons from the wafer surface are detected by a detector, a mark signal having such a waveform as shown in FIG. 4B is obtained. When an appropriate threshold level $L_o$ is set for the mark signal, and the mark signal is processed by using the threshold level $L_o$, a binary signal shown in FIG. 4C is obtained. At the same time as a scanning operation is started, a counter begins to count up clock pulses for the scanning operation, and the count value of the counter is read out at each edge of the binary signal. Thus, count values $P_1$ and $P_m$ are read out as shown in FIG. 4D. The count values $P_1$ and $P_m$ are data for indicating edge positions of the mark, and a value $(P_1 - P_m)/2$ indicates the mark position.

In the above method, however, there arise the following problems. That is, the waveform shown in FIG. 4B is not always kept constant, but varies as shown in FIG. 4E, in subsequent processes on the basis of the generation of distortion or the introduction of noise into the mark signal. In this case, a large number of false edge position data are mixed as shown in FIG. 4F, and a mark position is erroneously calculated. As a result, pattern writing accuracy is reduced. In many cases, in order to avoid such a fatal difficulty, the standard number of edge data is previously set. Further, when the number of detected edge data agrees with the standard number, the detected edge data are judged to be effective, and a mark position is determined on the basis of the detected edge data. When a portion of the bottom of a mark signal is raised as shown in FIG. 4E due to noise or others, the mark signal traverses the threshold level $L_o$ a multiplicity of times, and a large number of edge data are obtained. Accordingly, the number of edge data exceeds the standard number. That is, in the above method, the number of effective marks is limited, and thus the writability of patterns on a wafer, that is, the production yield of a desired wafer is reduced. Further, according to the above method, it is only after a mark detecting operation has been completed that judgement such as a mark position cannot be detected or is erroneously detected is made. Accordingly, a time necessary for the mark detecting operation is wasted, and thus the throughput is reduced. All of the above problems are based upon the fact that the mark signal contains noise and the waveform of the mark signal is distorted though effective information on edges of a mark is contained in the mark signal.

SUMMARY OF THE INVENTION

It is an object of the present invention to provide a mark detection system for use in a charged particle beam apparatus which system can solve the above problems of the prior art and can extract a true mark edge portion with high accuracy from a mark signal in such a manner that the true mark edge portion and the remaining portion of the mark signal are discriminated from each other.

In order to attain the above object, according to the present invention, there is provided a mark position detection system for use in a charged particle beam apparatus, wherein when a mark signal traverses a threshold level and has a peak value exceeding a predetermined value, the position of a charged particle beam at a time point at which the mark signal traverses the threshold level is detected to be used for determining the mark position. According to an aspect of the present invention, a mark position detection system for use in a charged particle beam apparatus comprises means for setting at least three threshold levels $L_0$, $L_1$ and $L_2$ for a mark signal so that a relation $L_1 > L_0 > L_2$ is satisfied, register means for temporarily storing data indicative of the position of a charged particle beam at each time point at which the mark signal traverses the threshold level $L_0$, and means for taking out the data indicative of the position of the charged particle beam from the register means at respective time point at which the mark signal traverses the threshold levels $L_1$ and $L_2$ after having traversed the threshold level $L_0$, to use the taken-out data as data indicative of a mark position data.

DESCRIPTION OF THE PREFERRED EMBODIMENTS

At first, explanation will be made of the operation principle of an inventive mark position detection system for use in a charged particle beam apparatus.

Figure 1A:
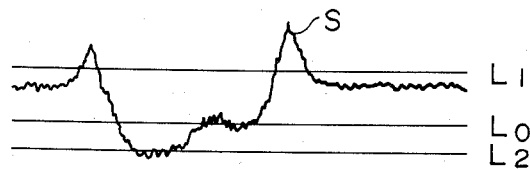
FIGS. 1A to 1F are schematic diagrams for explaining the operation principle of an inventive mark position detection system for use in a charged particle beam apparatus.
Figure 1B:

In the present invention, based on the observation that a peak level of a mark signal corresponding to a real edge portion of a mark is higher than a noise level, a mark position is detected in the following manner. That is, when a mark signal has a peak value exceeding a predetermined value and traverses a threshold level, a pulse generated at a time point at which the mark signal traverses the threshold level is used as a position signal indicative of a mark edge. In order to carry out such processing, for example, two threshold levels $L_1$ and $L_2$ are set in addition to the conventional threshold level $L_0$ for detecting a mark edge, as shown in FIG. 1A. When a mark signal S traverses the threshold level $L_1$, a first flip-flop (hereinafter referred to as "first FF") is set. When the mark signal S traverses the threshold level $L_2$ after having traversed the level $L_1$, the first FF is reset. As a result, the output of the first FF has such a waveform as shown in FIG 1B. Meanwhile, mark edge data detected on the basis of the threshold level $L_0$, that is, the corresponding count values of a counter which counts up clock pulses generated in accordance with the advance of a scanning operation, vary as indicated by symbols $P_l$—---$P_m$ in FIG. 1C.

Figure 1C:
Figure 1D:
Figure 1E:
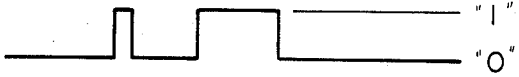
Figure 1F:

In the present invention, the mark edge data shown in FIG. 1C are temporarily stored in a register. FIG. 1D shows stored edge data. Further, when the mark signal traverses the threshold level $L_0$ as indicated by the symbols $P_l$—---$P_m$ in FIG. 1E, a second FF is set. The second FF is reset when the mark signal traverses the threshold level $L_1$ or $L_2$ after having traversed the threshold level $L_0$. Thus, the output of the second FF has such a waveform as shown in FIG. 1E. The edge data of FIG. 1D which are temporarily stored in the register include false edge data. When the contents of the register are fetched into a memory at falling edges of the waveform of FIG. 1E, edge data shown in FIG. 1F are stored in the memory. That is, false edge data due to the noise and waveform distortion are completely eliminated, and only true edge data $P_l$ and $P_m$ can be taken out.

In the above explanation, it is judged by using the threshold levels $L_1$ and $L_2$ whether the peak value of the mark signal exceeds a predetermined value or not. Alternatively, the above judgement may be exercised by differentiating the mark signal.

Figure 2:
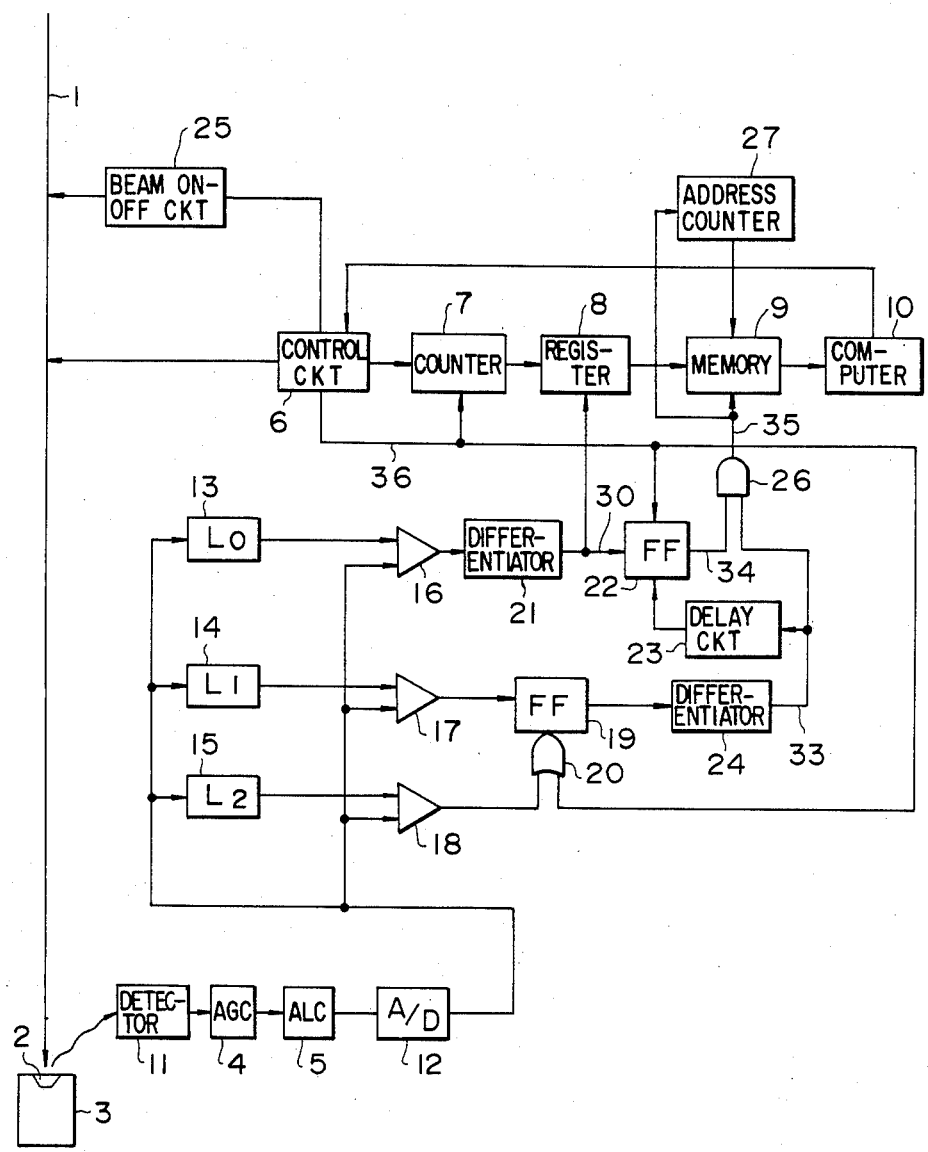
FIG. 2 is a block diagram showing the circuit configuration of an embodiment of an inventive mark position detection system for use in a charged particle beam apparatus.
Figure 3A:
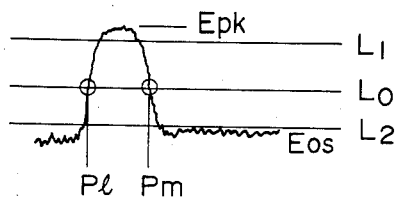
FIGS. 3A to 3D are waveform charts showing examples of the relation between a mark signal and three threshold levels.
Figure 3B:
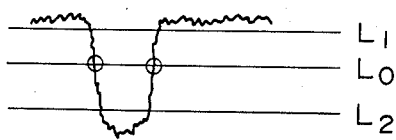
Figure 3C:
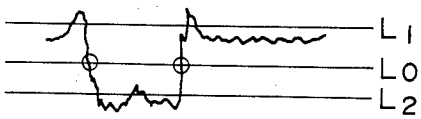
Figure 3D:
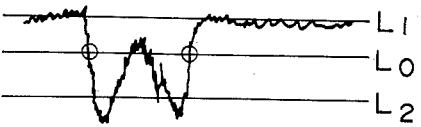
Figure 4A:
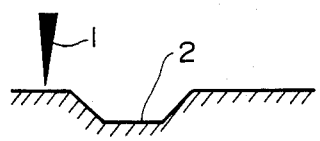
FIGS. 4A to 4F are schematic diagrams for explaining examples of the operation of a conventional mark position detection system for use in a charged particle beam apparatus.
Figure 4B:
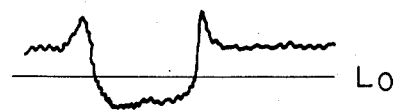
Figure 4C:
Figure 4D:
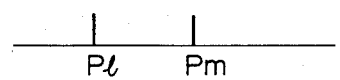
Figure 4E:
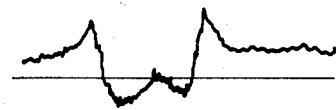
Figure 4F:
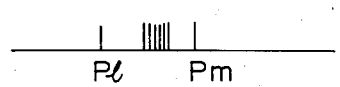

Now, an embodiment of a mark position detection system according to the present invention will be explained below, with reference to FIGS. 2 and 3A to 3D. FIG. 2 is a block diagram showing the present embodiment, and FIGS. 3A to 3D are waveform charts showing examples of the relation between a mark signal and three threshold levels $L_0$, $L_1$ and $L_2$ which are used in the present invention. In more detail, FIG. 3A shows a case where a mark signal has an upwardly convex waveform, and FIGS. 3B to 3D show cases where a mark signal has a downwardly convex waveform. The operation of the present embodiment for a mark signal having the waveform of FIG. 3A will be explained below.

In FIG. 2, reference numeral 1 designates an electron beam, and 2 a mark formed in the surface of a specimen 3. Referring now to FIG. 2, a control circuit 6 controls a beam on-off circuit 25 on the basis of a pattern-writing start command from a computer 10, and deflects the electron beam 1 in accordance with the starting point of each scanning line, a scanning pitch and a scanning distance which are previously determined. A detector 11 detects electrons reflected from the specimen surface having the mark 2, to generate a mark signal. The mark signal from the detector 11 is processed by an automatic gain control circuit 4 and an automatic level control circuit 5 so that the amplitude and offset level of the mark signal are kept constant. The mark signal thus processed is converted by an analog-to-digital converter 12 into a digital code.

The output of the analog-to-digital converter 12 is applied to an $L_0$-level setting circuit 13, an $L_1$-level setting circuit 14 and an $L_2$-level setting circuit 15. In the circuits 13, 14 and 15, threshold levels $L_0$, $L_1$ and $L_2$ are set in the following manner. When the maximum and minimum levels of a mark signal obtained by scanning the specimen surface having the mark with the electron beam in the direction from left to right are expressed by $E_{PK}$ and $E_{OS}$, respectively, a level equal to $(E_{PK}-E_{OS})/2$ is set as the threshold level $L_0$, a d.c. level which is lower than the maximum level $E_{PK}$ and higher than the level $L_0$, is set as the threshold level $L_1$, and a d.c. level which is higher than the minimum level $E_{OS}$ and lower than the level $L_0$, is set as the threshold level $L_2$. The threshold levels $L_0$, $L_1$ and $L_2$ are determined in the above manner, for a case where the mark signal has such a waveform as shown in FIG. 3A. In a case where the waveform of the mark signal is downwardly convex and moreover is distorted, as shown in FIGS. 3C and 3D, the threshold levels $L_0$, $L_1$ and $L_2$ are determined in the following manner. That is, a d.c. level which is higher than a minimum level of a mark signal obtained by scanning the specimen surface having the mark from the left end to the right end of the specimen surface with the electron beam, and is lower than the threshold level $L_0$, is set as the threshold level $L_2$, and a d.c. level higher than the offset level of the mark signal is set as the threshold level $L_1$.

The threshold level $L_0$ set by the $L_0$-level setting circuit 13 is applied to one input terminal of a comparator 16, the other input terminal of which is applied with the output of the analog-to-digital converter 12. Thus, the output of the converter 12, that is, the mark signal is converted into a binary signal on the basis of whether or not the mark signal is greater than the threshold level $L_0$. The binary signal is applied to a differentiating circuit 21, to be subjected to a differentiating operation. Thus, the differentiating circuit 21 delivers a pulse to an output line 30 each time the mark signal traverses the threshold level $L_0$. The control circuit 6 delivers a clock pulse to a counter 7 each time the control circuit 6 deflects the electron beam 1 by a small distance, for example, 0.02 μm, and the output of the counter 7 is applied to the data input terminal of a register 8. Meanwhile, the output line 30 of the differentiating circuit 21 is connected to the write strobe input terminal of the register 8 and the set terminal of an FF (namely, a flip-flop circuit) 22. Accordingly, when a pulse is delivered from the differentiating circuit 21 to the output line 30, the contents of the counter 7 are latched by the register 8, that is, a value $P_l$ shown in FIG. 3A and corresponding to an edge of the mark 2 is latched.

On the other hand, the threshold level $L_1$ set by the $L_1$-level setting circuit 14 is applied to one input terminal of a comparator 17 through an output line 31, and the other input terminal of the comparator 17 is applied with the output of the analog-to-digital converter 12. Further, the threshold level $L_2$ set by the $L_2$-level setting circuit 15 is applied to one input terminal of a comparator 18 through an output line 32, and the other input terminal of the comparator 18 is applied with the output of the analog-to-digital converter 12. The output of the comparator 17 is applied to the set terminal of an FF 19, and the output of the comparator 18 is applied to the reset terminal of the FF 19 through an OR-gate 20. Accordingly, when the output level of the analog-to-digital converter 12 becomes higher than the threshold level $L_1$ on the output line 31, the output state of the comparator 17 is reversed, and thus the FF 19 is set. As a result, the output level of the FF 19 is varied, and a differentiating circuit 24 delivers a pulse to an output line 33. The pulse on the output line 30 which indicates the discovery of an edge of the mark, that is, indicates that the mark signal traverses the threshold level $L_0$, sets the FF 22, and hence the output line 34 of the FF 22 takes a level "1". Thus, two input terminals of an AND-gate 26 connected with the output lines 33 and 34 are both put to the level "1". As a result, a write pulse for writing the contents of the register 8 into a memory 9 appears on the output line 35 of the AND-gate 26. That is, the value $P_l$ of FIG. 3A is written in the memory 9.

Further, the pulse on the output line 33 is delayed by a delay circuit 23, and then applied to a reset terminal of the FF 22. Thus, after a time necessary for writing the contents of the register 8 into the memory 9 has elapsed, the FF 22 is reset.

When the scanning operation of the electron beam 1 is advanced and the level of the mark signal becomes lower than the threshold level $L_1$ on the output line 31, the output state of the comparator 17 is reversed, that is, the output thereof takes a level "0". However, the output of the FF 19 is kept at the level "1", since the FF 19 is of the edge trigger type. Hence, the differentiating circuit 24 does not deliver a pulse to the output line 33. Accordingly, a write strobe pulse for the memory 9 is not generated. As a result, even if the comparator 16 is operated by, for example, noise, and thus false mark edge data is held by the register 8, there will be no fear of the memory 9 taking in the false mark edge data.

When the scanning operation of the electron beam 1 is advanced and the level of the mark signal is further reduced, the output state of the comparator 16 is reversed at a time the mark signal traverses the threshold level $L_0$. Thus, the differentiating circuit 21 delivers a pulse to the output line 30, and hence mark edge data (that is, the value $P_m$ of FIG. 3A) is held by the register 8. At this time, however, the output line 33 is kept at the level "0", and hence the above data is not written in the memory 9. When the level of the mark signal further decreases with the advance of the scanning operation and becomes lower than the threshold level $L_2$ on the output line 32 of the $L_2$-level setting circuit 15, the output of the comparator 18 resets the FF 19. Thus, the differentiating circuit 24 delivers a pulse to the output line 33. At this time, the FF 22 is kept at the set state, and the output line 34 is kept at the level "1". Accordingly, a write pulse appears on the output line 35 of the AND-gate 26, and the mark edge data which is temporarily stored in the register 8 (that is, the value $P_m$ of FIG. 3A) is written in the memory 9. An address, at which the mark edge data is to be stored in the memory 9, is set by an address register 27 which is incremented by the write pulse on the output line 35.

When the scanning operation of the electron beam for one scanning line is advanced to the right end thereof, that is, is completed, the control circuit 6 delivers a reset pulse to an output line 36, to reset (namely, initialize) the counter 7, the FF 22 and the FF 19. Thereafter, the control circuit 6 deflects the electron beam 1 to the starting point of the next scanning line, and the above-mentioned scanning operation is repeated a desired number of times.

In the above, the operation of the present embodiment for a case where the mark signal having the waveform of FIG. 3A is generated and the threshold levels $L_0$, $L_1$ and $L_2$ has a relation $L_1 > L_0 > L_2$, has been explained. In a case where the mark signal has such a downwardly convex waveform as shown in FIGS. 3B, 3C and 3D, also, the present embodiment can take out only true mark edge data $P_l$ and $P_m$ by using three threshold levels $L_0$, $L_1$ and $L_2$.

In the present embodiment, the processing for taking out only true mark edge data is carried out by hardware. However, the above processing may be carried out by software.

As has been explained in the foregoing, according to the present invention, only mark edge portions can be accurately extracted from the mark signal. Accordingly, a mark position detection system according to the present invention is far superior to the conventional mark position detection in two points. That is, the present invention is higher in accuracy of detected mark position than the prior art. Further, according to the present invention, there is not any fear of detecting a false mark position. Thus, the production yield of a workpiece is improved, and the throughput is increased.

It is to be noted that the present invention is not limited to a mark position detection system for use in an electron beam lithography apparatus, but is applicable to a length measuring system for measuring the line width of circuit pattern in a semiconductor integrated circuit, or a mark position detection system using other charged particle beams than the electron beam, for example, an ion beam.

We claim:

1. A mark position detection system for use in a charged particle beam apparatus, comprising:

detection means for detecting electrons generated at a mark when the mark is scanned with a charged particle beam, to obtain a mark signal; and signal processing means for comparing the mark signal from the detection means with a first predetermined threshold level $L_0$ to find the position of the charged particle beam at a time point at which the mark signal traverses the first predetermined threshold level $L_0$ so as to detect the position of the mark, said signal processing means being arranged such that when the mark signal traverses the first predetermined threshold level $L_0$ and traverses at least one of a second predetermined threshold level $L_1$ higher than the first predetermined threshold level $L_0$ and a third predetermine threshold level $L_2$ lower than the first predetermined threshold level $L_0$, it is determined that the position of the charged particle beam at a point at which the mark signal traverses the first predetermined threshold level $L_0$, is the position of the mark.

2. A mark position detection system according to claim 1, further comprising threshold level setting means for setting the predetermined threshold levels $L_0$, $L_1$ and $L_2$ for the mark signal, register means for temporarily storing data indicative of the position of the charged particle beam at each time point at which the mark signal traverses the first predetermined threshold level $L_0$ and means for taking out the data indicative of the position of the charged particle beam from the register means when the mark signal traverses a respective one of the second and third predetermined threshold levels $L_1$ and $L_2$ after having traversed the first predetermined threshold level $L_0$, to use the taken-out data as data indicative of the position of the mark.

3. A mark position detection system according to claim 2, wherein when maximum and minimum levels of the mark signal obtained by scanning the mark with the charged particle beam are expressed by $E_{PK}$ and $E_{OS}$, respectively, the threshold level setting means sets a level equal to $(E_{PK}-E_{OS})/2$ as the first predetermined threshold level $L_0$, sets a d.c. level lower than the maximum level $E_{PK}$ as the second predetermined threshold level $L_1$, and sets a d.c. level higher than the minimum level $E_{OS}$ as the third predetermined threshold level $L_2$.

4. A mark position detection system according to claim 1, wherein said signal processing means is arranged to determine the position of the mark based upon time points at which the mark signal traverses the first predetermined threshold level $L_0$, when the mark signal traverses the second predetermined threshold level $L_1$ after traversing the first predetermined threshold level $L_0$, and when the mark signal traverses the third predetermined threshold level $L_2$ after traversing the first predetermined threshold level $L_0$.

* * * * *